(12) United States Patent
Chang

(10) Patent No.: US 7,840,836 B2
(45) Date of Patent: Nov. 23, 2010

(54) STORAGE DEVICE AND DATA WRITING METHOD UTILIZING THE SAME

(75) Inventor: Hui-Neng Chang, Bade (TW)

(73) Assignee: A-Data Technology Co., Ltd., Taipei (TW)

( * ) Notice: Subject to any disclaimer, the term of this patent is extended or adjusted under 35 U.S.C. 154(b) by 640 days.

(21) Appl. No.: 11/878,957

(22) Filed: Jul. 30, 2007

(65) Prior Publication Data

US 2008/0215911 A1 Sep. 4, 2008

(30) Foreign Application Priority Data

Mar. 2, 2007 (TW) ................................ 96107196 A

(51) Int. Cl.
*G06F 11/00* (2006.01)
(52) U.S. Cl. ............................................. 714/5; 714/11
(58) Field of Classification Search ................... 714/5, 714/6, 7, 8–13, 710, 718; 711/162, 170
See application file for complete search history.

(56) References Cited

U.S. PATENT DOCUMENTS

| 6,598,174 | B1 * | 7/2003 | Parks et al. | ................... 714/6 |
| 7,467,275 | B2 * | 12/2008 | Sakashita et al. | ............ 711/165 |
| 2006/0277380 | A1 * | 12/2006 | Sicola | ........................ 711/165 |

* cited by examiner

*Primary Examiner*—Dieu-Minh Le
(74) *Attorney, Agent, or Firm*—Rosenberg, Klein & Lee

(57) ABSTRACT

A storage device capable of meeting the reliability has a storage capacity and the reliability of the storage device is defined. The storage device includes at least one first storage unit, at least one second storage unit, and a control unit. The first storage unit forms the storage capacity of the storage device. The second storage unit is allocated to form a spare capacity according to the storage capacity and the reliability. The second storage unit replaces the bad blocks in the first storage unit. The control unit controls the first storage unit and the second storage unit to transmit and convert the data with an application system. Thereby, by allocating the spare capacity of the second storage unit, the different reliability requirement is met, and the storage capacity of the first storage unit is unaffected.

21 Claims, 5 Drawing Sheets

STORAGE DEVICE AND DATA WRITING METHOD UTILIZING THE SAME

BACKGROUND OF THE INVENTION

1. Field of the Invention

The present invention relates to a storage device. In particular, this invention relates to a storage device that is capable of meeting the reliability and a building and writing method thereof.

2. Description of the Related Art

Recently, because technology has been developing rapidly, the requirements of storage devices for a variety of devices has increased. Tape reel drives, floppy disk drives, hard disk drives, and silicon storage devices (such as portable disks, card-reading devices or solid state disks (SSD), est.) have been developed to meet the requirements of storing a great amount of data and easy usage. Silicon storage devices use a storage memory (such as flash memory) as a storage medium. They are small, power-efficient, stable, have excellent anti-shock capabilities, and a fast access speeds. Because they are non-volatile and their design is simple, a lot of equipment in the market integrates with storage devices to increase their functions.

However, after a flash memory has been repeatedly erased, read and written, the flash memory may become worn out. When the number of bad blocks accumulates and surpasses the number of spare blocks, the reliability of the flash memory decreases. At this time, the storage device shows a system error message due to the flash memory being unable to provide enough available space, for example, the storage shows a read-only status.

In order to overcome such a reliability problem, several methods are available. One method is that an expensive and more reliable storage memory (such as an SLC flash) is adopted to slow down the deterioration of the drive. Another is that a wearing-leveling algorithm is used to access the storage memory so that the data can be normally written into the memory blocks. Therefore, the memory blocks of the storage memory can be used in turn to average the usage rate of each memory block and prevent one single memory block from being used more frequently than others and becoming damaged. A further method is that an error correcting code (ECC) in the controller of the storage device is improved to detect errors of transmitted data. When a bit error is detected, the bit error can be automatically corrected to guarantee the transmitting data and increase the reliability of the storage device. Furthermore, parts of the storage memory are divided to form a spare space and are reserved to replace bad blocks of the storage memory. However, the available capacity of the storage device is smaller than its real capacity.

Because the application fields of the storage device are widespread, and include commercial fields, industrial fields, and military fields, and the reliability for each field is different, the firmware on the storage device must be modified for each field by using the above methods. This means that spare space of different capacities has to be reserved for different reliability. The available capacity is subsequently affected.

SUMMARY OF THE INVENTION

One particular aspect of the present invention is to provide a storage device capable of meeting the reliability. By using a simple hardware circuit, an additional spare memory is added. According to the reliability requirement of the storage device, a proper spare space is allocated. By using this structure, when the storage device is applied to different fields in which its reliability requirements are different, the spare space with a proper capacity is allocated to meet the reliability requirement. Therefore, the user does not need to use a different storage capacity due to the storage device needing a different reliability requirement, and the firmware in the storage device does not need to be modified to meet each reliability requirement.

The storage device capable of meeting the reliability has a storage capacity and the reliability of the storage device is defined. The storage device includes at least one first storage unit, at least one second storage unit, and a control unit. The first storage unit forms the storage capacity of the storage device for storing data. The second storage unit is allocated to from spare capacity according to the storage capacity and the reliability. The second storage unit is correspondingly connected with the first storage unit and uses a block as a unit to replace the first storage unit. The control unit controls the operations of the first storage unit and the second storage unit to transmit and convert the data with an application system. By allocating the spare capacity of the second storage unit, different reliability requirements can be met, and the storage capacity of the first storage unit is unaffected.

The present invention also provides a building method for the storage device capable of meeting the reliability. The storage device includes a first storage unit. The steps of the building method include determining a storage capacity formed by the first storage unit. The storage capacity is capacity available for the user. Next, the required reliability of the storage device is defined, and a spare capacity is generated according to the storage capacity and the reliability. Finally, a second storage unit is allocated according to the spare capacity so that the storage capacity of the first storage unit in the storage device can be replaced by the spare capacity of the second storage unit when the storage block in the storage capacity is worn out. Thereby, the storage device uses the first storage unit and the second storage unit to build the storage device capable of meeting the reliability. By allocating the spare capacity of the second storage unit to meet the different reliability requirements, the storage capacity of the first storage unit is unaffected.

The present invention also provides a data writing method for the storage device capable of meeting the reliability. The storage device includes a first storage unit and a second storage unit. The first storage unit forms a storage capacity and the second storage unit forms a spare capacity. Firstly, written data is received, and the written data is written into the first storage unit. During the writing process, if the storage block of the first storage unit is worn out and fails to write the data to the storage block, an available space in the second storage unit is obtained, one block in the available space is used as a unit to replace the worn out storage block in the first storage unit, and the data is written. By allocating the spare capacity of the second storage unit to meet the different reliability requirements, the storage capacity of the first storage unit is unaffected. Under the reliability requirement, the storage capacity of the storage device will not decrease due to the storage block of the first storage unit being worn out.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
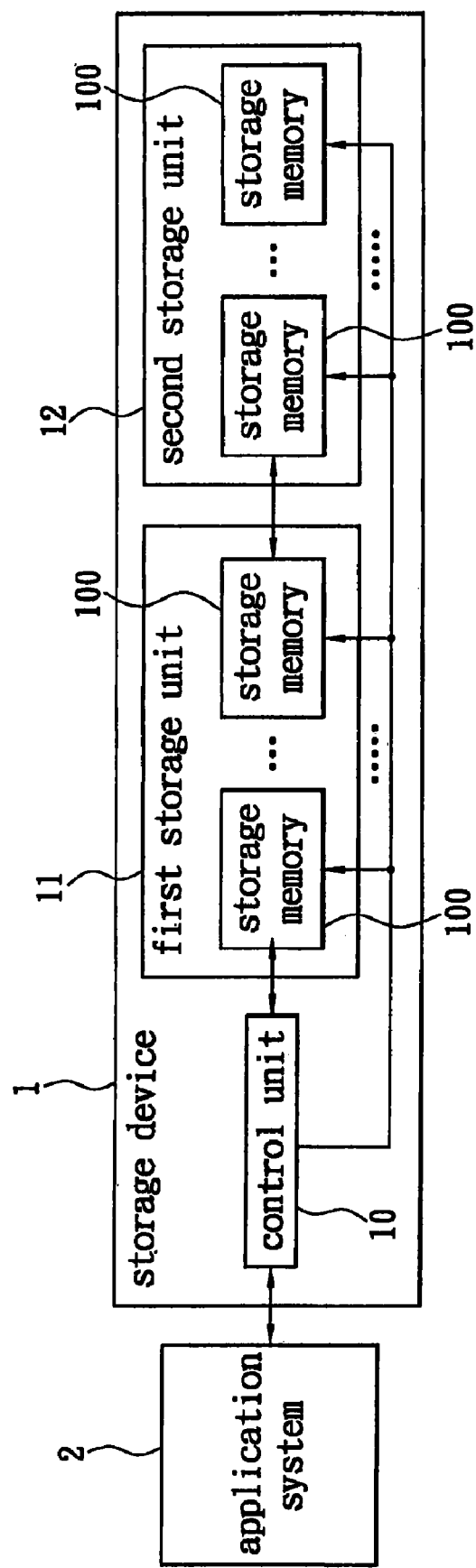
FIG. 1 is a block diagram of the storage device capable of meeting the reliability of the first embodiment of the present invention.

Reference is made to FIG. 1, which shows a block diagram of the storage device capable of meeting the reliability of the first embodiment of the present invention. The storage device capable of meeting the reliability 1 has a storage capacity and the storage capacity is a space in the storage device 1 that can be accessed by the user. The storage device 1 has an interface, such as a USB interface, an IDE interface, an SATA interface, a PCI interface, a PCI express interface, an IEEE 1394 interface, or other common interfaces. The storage device 1 includes a control unit 10, at least one first storage unit 11, and at least one second storage unit 12. The control unit 10 controls the first storage unit 11 and the second storage unit 12 to transmit and convert the data with an application system 2. The first storage unit 11 includes at least one storage memory 100. The second storage unit 12 also includes at least one storage memory 100. The control unit 10 respectively uses a chip enable (CE) signal to control the storage memory 10 of the first storage unit 11 and the second storage unit 12.

The total storage capacity of the storage memory 10 in the first storage unit 11 is the storage capacity of the storage device 1 provided to the user. The second storage unit 12 is correspondingly connected with the first storage unit 11 and the storage memory 10 of the second storage unit 12 forms a spare capacity. When the first storage unit 11 has a bad block, one block is used as a unit to replace to the first storage unit 11. The storage block address of the bad block in the first storage unit 11 is changed to indicate the available block address in the second storage unit 12.

The reliability requirement for the storage device 1 can be divided into different levels according to the application field or the target market. For example, according to the usage attributes of the storage device 1, the reliability requirement can be divided into a commercial level, an industrial level, or a military level. For different application fields, the storage device 1 with different levels of reliability requirement is adopted. The accepted usage life is also different. For the level of high reliability requirement, the storage device 1 needs a larger spare capacity to replace worn out blocks during the usage life of the storage device 1. This means that the spare capacity of the second storage unit 12 is allocated according to the reliability requirements of the storage device 1.

The storage capacity of the storage device 1 and the default endurance of the first storage unit 11 also determine the spare capacity of the second storage unit 12. When the storage capacity is large and the reliability requirements for the storage device 1 are met, the spare capacity of the second storage unit 12 has to be allocated to meet the requirements and replace the worn out blocks. The default endurance of the first storage unit 11 is a number that the storage memory 100 can erase when the storage memory 100 is shipped. The default endurance is also a factor for determining the first storage unit 11 that can be accessed reliably. Except for the above factors that affect the spare capacity of the second storage unit 12, other factors can be added to allocate a best spare capacity for the second storage unit 12.

Figure 2A:
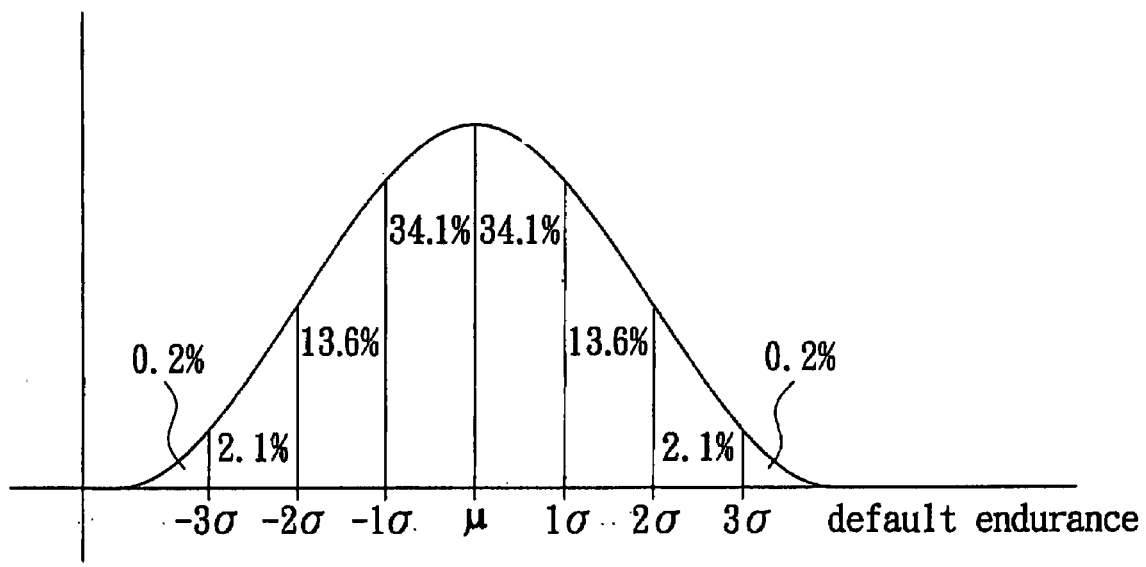
FIG. 2A is a normal distribution diagram of the default endurance of the storage memory of the storage device.
Figure 2B:
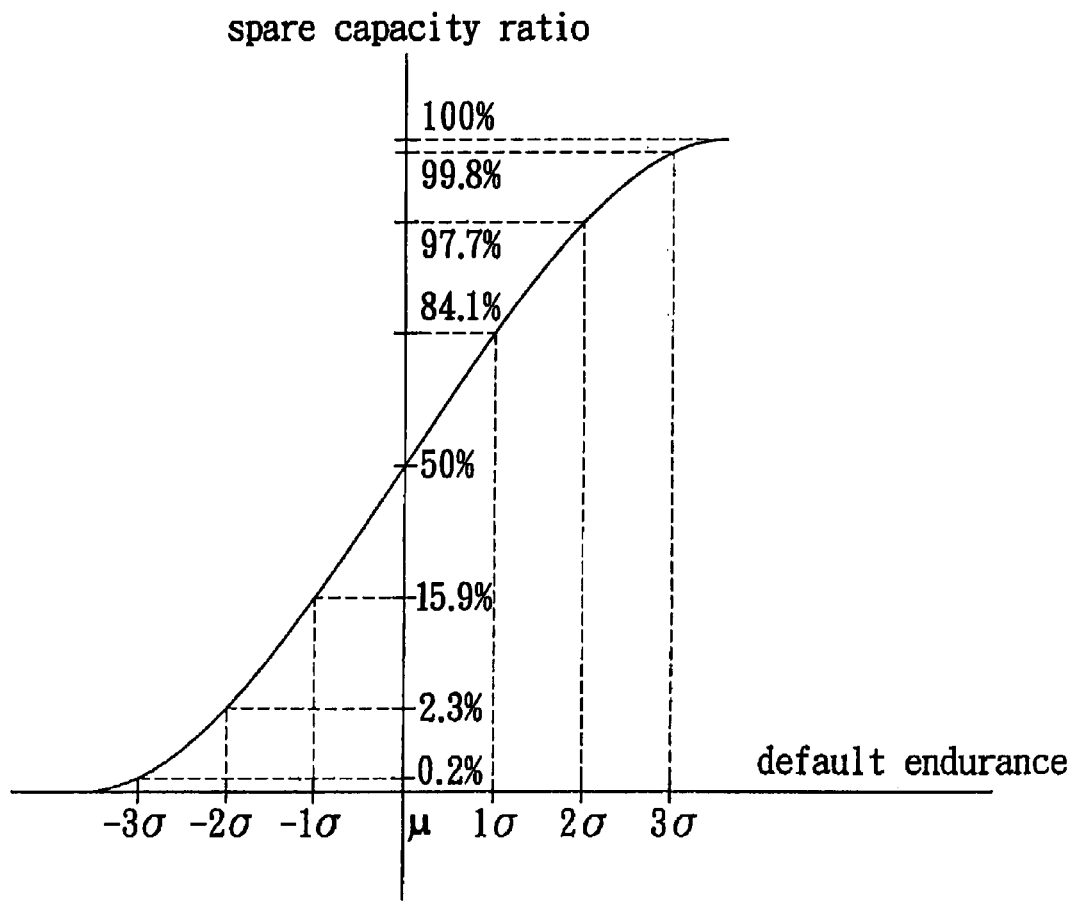
FIG. 2B is a matching diagram of a relationship between the default endurance of the storage memory of the storage device and the percentage of the spare capacity.

In order to illustrate the converting relationship between the spare capacity and the reliability of the reliable storage device 1, reference is made to FIGS. 2A and 2B, which show a normal distribution diagram of the default endurance of the storage memory of the storage device, and a matching diagram of a relationship between the default endurance of the storage memory of the storage device and the percentage of the spare capacity. The default endurance of the storage memory 100 affects the reliability of the first storage unit 11. In statistics, it is the normal distribution of the average value ($\mu$) and the standard deviation ($\sigma$) as shown in FIG. 2. We can convert the average value ($\mu$) and the standard deviation ($\sigma$) of the default endurance to the reliability of the storage device 1. For example, 50% of storage memory 100 of the storage device 1 can successfully execute the erase operation "$\mu$" times, 84.1% of storage memory 100 can successfully execute the erase operation "$\mu-1\sigma$" times, 97.7% of storage memory 100 can successfully execute the erase operation "$\mu-2\sigma$" times, etc. The area contained in the normal distribution curve is accumulated to obtain the matching relationship as shown in FIG. 2B. When the average value and the standard deviation of the default endurance of the storage memory 100 is $\mu$ and $\sigma$ and the requested reliability is $\mu-3\sigma$, 0.2% of the first storage unit is reserved to be the spare capacity for meeting the requested reliability. When the requested reliability is $\mu-2\sigma$, 2.3% of the first storage unit is reserved as the spare capacity for meeting the requested reliability. When the requested reliability is $\mu-1\sigma$, 15.9% of the first storage unit is reserved as the spare capacity for meeting the requested reliability, etc. The higher the level of the reliability is, the larger the reserved spare capacity is. Alternatively, the lower the level of the reliability requested by the user is, the smaller the reserved spare capacity is. Therefore, by referring to the matching diagram, the storage device 1 allocates the spare capacity of the second storage unit 12 according to the reliability and the storage capacity of the first storage unit 11. The above description is merely an example for illustrating the converting relationship between the spare capacity and the reliability. Depending on the application, other factors can be added to allocate the optimum spare capacity of the second storage unit 12 for meeting the requested reliability.

Figure 3:
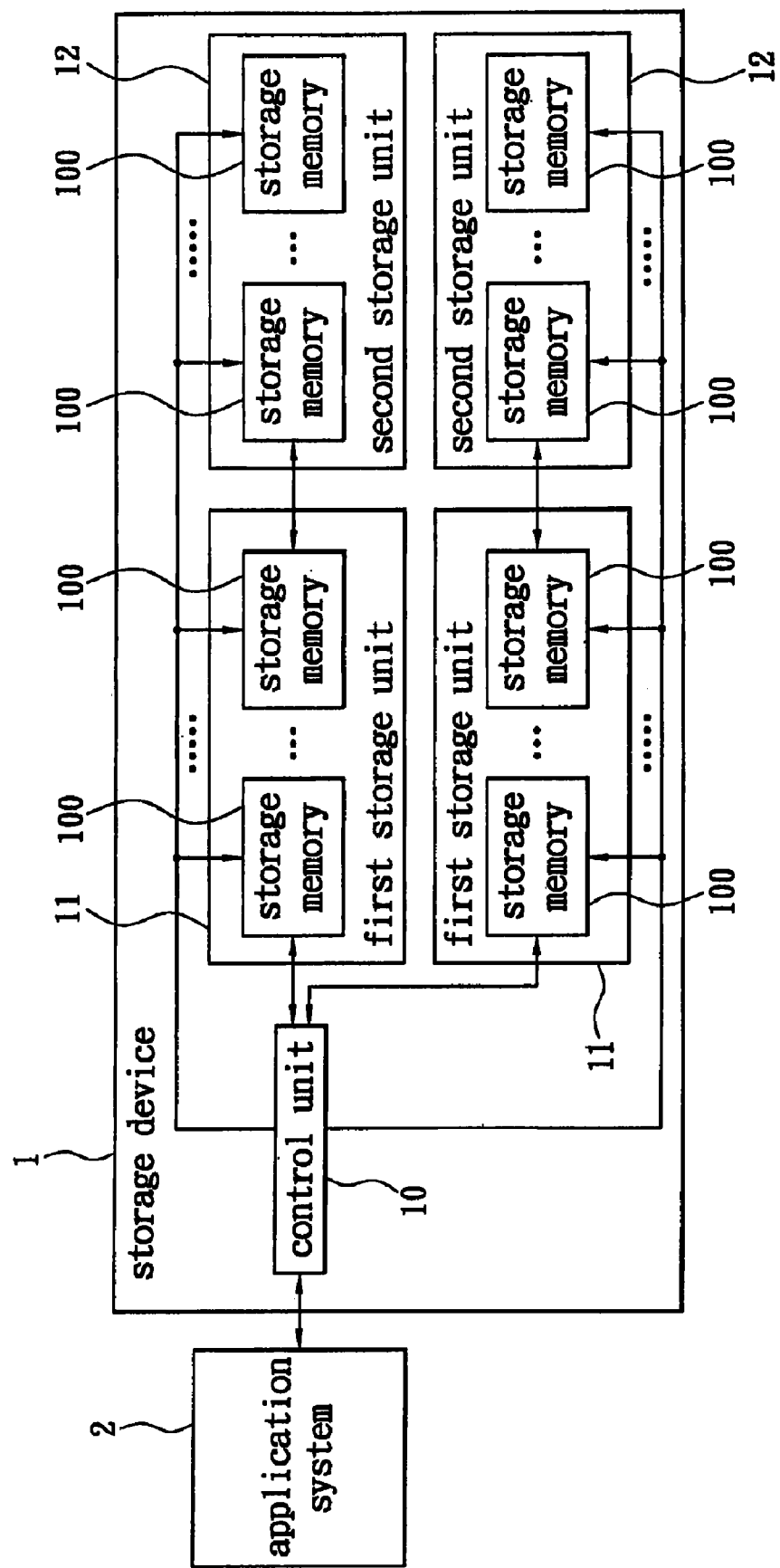
FIG. 3 is a block diagram of the storage device capable of meeting the reliability of the second embodiment of the present invention.

Furthermore, in order to speed up the accessing speed of the storage device 1, the control unit 10 in the storage device 1 can be a control IC that supports single-channel, dual-channel, or multiple-channels (such as 4-channels or 8-channels). Reference is made to FIG. 3, which shows a block diagram of the storage device capable of meeting the reliability of the second embodiment of the present invention. The dual-channel design is used as an example. The operation of this embodiment is almost the same as the previous one. The difference is that a dual-channel design is adopted in the storage device 1. Therefore, the number of the first storage unit 11 and the second storage unit 12 is determined by the channel number supported by the control unit 10. In this embodiment, the control unit 10 is connected with two first storage units 11 in parallel to synchronously process data for speeding up the accessing speed. The two first storage units 11 are respectively connected with a second storage unit 12 for individually replacing the memory to meet the reliability requirements.

Figure 4:
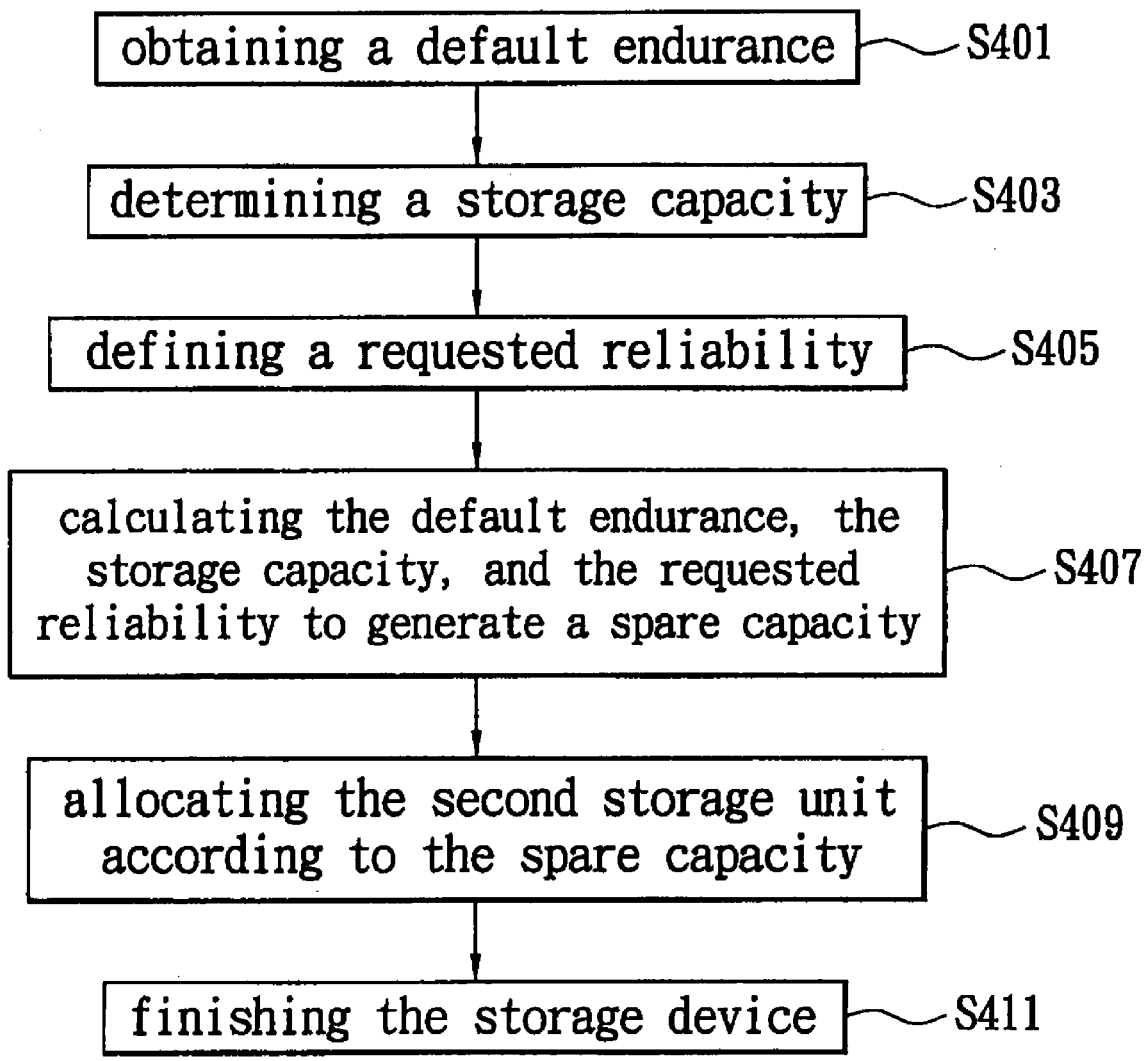
FIG. 4 is a flow chart of the building method for the storage device capable of meeting the reliability of the present invention.

Reference is made to FIG. 4, which shows a flow chart of the building method for the storage device capable of meeting the reliability of the present invention. Firstly, the default endurance of the storage memory 100 of the first storage unit in the storage device 1 is obtained (S401). Next, the storage capacity of the first storage unit 11 is determined (S403). The storage capacity is the capacity of the first storage unit 11 that can be accessed by the user. The reliability of the storage device 1 is defined according to the application attribution or the target market (S405). Next, the default endurance, the storage capacity, and the requested reliability are considered to obtain the proper spare capacity (S407). By referring to the spare capacity, the space capacity of the storage memory 100 of the second storage unit 12 is allocated (S409) for meeting the requested reliability to replace the bad block in the first storage unit 11. Finally, the first storage unit 11 and the second storage unit 12 are configured in the storage device 1 to form the storage device capable of meeting the reliability. The spare capacity allocated in the second storage unit 12 will not affect the storage space provided by the first storage unit 11 for the user.

Figure 5:
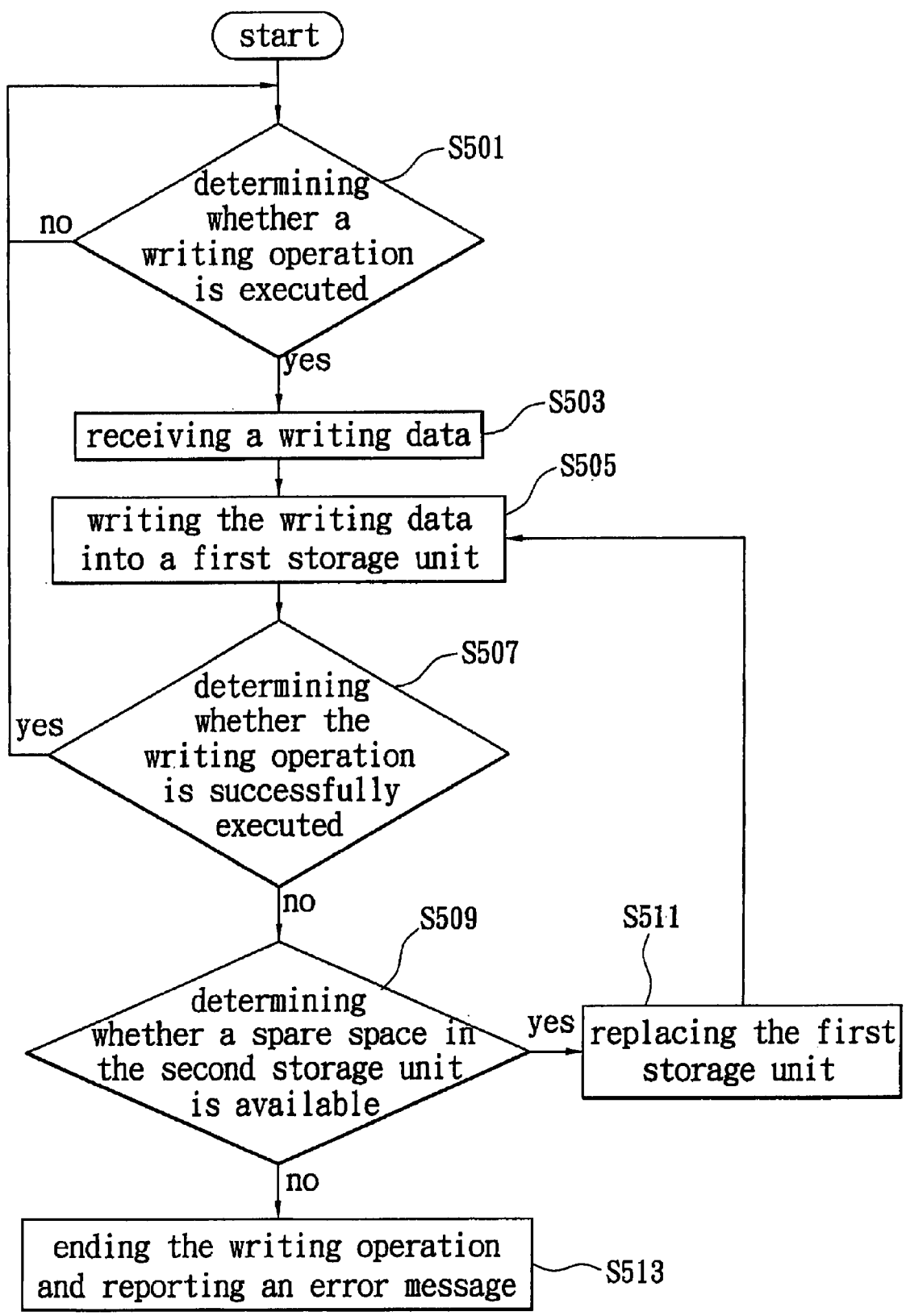
FIG. 5 is a flow chart of the data writing method for the storage device capable of meeting the reliability of the present invention.

Reference is made to FIG. 5, which shows a flow chart of the data writing method for the storage device capable of meeting the reliability of the present invention. This embodiment illustrates the operations between the first storage unit 11 and the second storage unit 12 when data is written into the storage device 1 capable of meeting the reliability. Firstly, whether data writing operation is being executed on the storage device 1 is determined (S501). If the data writing operation is being executed on the storage device 1, the writing data is received (S503) and the writing data is written into the storage blocks of the first storage unit 11 (S505). Next, whether the writing operation is successfully executed or not is determined (S507). If the writing operation fails, this means that the storage block of the first storage unit 11 is bad and makes the writing operation fail. At this time, whether a spare space in the second storage unit 12 can be obtained for replacing the bad block (S509). The spare space is enough to replace all bad blocks in the first storage unit 11. If the spare space in the second storage unit 11 is available, the spare space in the second storage unit 12 uses one block as an unit to replace all bad blocks in the first storage unit 11 (S511). In other words, the control unit 10 in the storage device 1 changes the address to indicate the spare block of the second storage unit 12 from the original bad storage block in the first storage unit 11 and continuously executes the writing operation.

When the result of step S501 is negative or the result of the step S507 is positive, they respectively mean that there is no data for the writing operation and the writing data is successfully written into the first storage unit 11. At this time, whether another piece of data needs to be executed by the writing operation it is continuously monitored to execute the writing operation. Furthermore, when the result of step S509 is negative, this means that the spare space in the second storage unit 12 has been fully occupied and there is no available space. Therefore, the writing data cannot be written into the storage device and the writing operation ends (S513). The storage device 1 feeds back an error message to the application system 2.

The storage device 1 of the present invention that meets the requested reliability utilizes the spare capacity formed by the second storage unit 12 to meet the requested reliability. Even though the storage device 1 is applied to different reliabilities, the storage capacity of the first storage unit 10 is unaffected. The user can uses the same storage capacity, and the firmware in the storage device 1 does not need to be substantially modified to be suitable for different reliability.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A storage device having a storage capacity and associated with a predetermined reliability, the storage device comprising:
    at least one first storage unit for forming the storage capacity;
    at least one second storage unit to from having a spare capacity and connected with the first storage unit, wherein a size and an address of the spare capacity is determined according to the storage capacity and the predetermined reliability; and
    a control unit for controlling the first storage unit and the second storage unit to convert data with an application system.

2. The storage device as claimed in claim 1, wherein the storage device has a USB interface, an IDE interface, an SATA interface, a PCI interface, a PCI express interface, an IEEE 1394 interface, or other common interfaces.

3. The storage device as claimed in claim 1, wherein the first storage unit and the second storage unit comprise at least one storage memory.

4. The storage device as claimed in claim 1, wherein the second storage unit is used for replacing the first storage unit when a storage block of the storage capacity of the first storage unit is worn out.

5. The storage device as claimed in claim 1, wherein the second storage unit uses one block as a unit to replace the first storage unit.

6. The storage device as claimed in claim 1, wherein the control unit is a control IC that supports single-channel, dual-channels, or multiple-channels, and the number of the first storage unit and the second storage unit is determined by the channel number of the control unit.

7. The storage device as claimed in claim 1, wherein the second storage unit is configured to further utilize a predetermined endurance of the first storage unit and the predetermined reliability of the storage device to allocate the size spare capacity.

8. The storage device as claimed in claim 7, wherein the predetermined reliability of the storage device is defined according to usage attributes or product segmentation.

9. The storage device as claimed in claim 8, wherein the usage attributes are commercial attributes, industrial attributes, or military attributes.

10. A method for operating a storage device having a first storage unit and a second storage unit coupled to the first storage comprising:
    determining a storage capacity formed by the first storage unit;
    defining a predetermined reliability required for the storage device;
    determining a size of a spare capacity according to the storage capacity and the predetermined reliability; and
    allocating the spare capacity at an address associated with the allocated spare capacity in the second storage unit.

11. The method for operating the storage device as claimed in claim 10, wherein the size of the spare capacity is further determined according to a predetermined endurance of the first storage unit.

12. The method for operating the storage device as claimed in claim 10, wherein the predetermined reliability is defined according to a usage attribute or a product segmentation of the storage device.

13. The method for operating the storage device as claimed in claim 12, wherein the usage attribute is a commercial attribute, an industrial attribute, or a military attribute.

14. The method for operating the storage device as claimed in claim 10, wherein the first storage unit and the second storage unit comprise at least one storage memory.

15. The method for operating the storage device as claimed in claim 10, wherein the second storage unit is used for replacing the first storage unit when a storage block of the first storage unit is worn out.

16. The method for operating the storage device as claimed in claim 10, wherein the second storage unit uses one block as a unit to replace the first storage unit.

17. A data writing method for utilizing a storage device having a first storage unit and a second storage unit, wherein the first storage unit forms a storage capacity of the storage device and the second storage unit provides the storage device with a spare capacity, and a size of the spare capacity is determined in accordance with a predetermined reliability of the storage device, the steps of the data writing method comprising:

receiving a writing data, and writing the writing data into the first storage unit;

allocating a spare block from the second storage unit according to the size of the spare capacity determined in accordance with the predetermined reliability of the storage device when a storage block of the first storage unit is worn out and failing to write the writing data into the storage block; and transferring the writing data into the spare block.

18. The data writing method for the storage device as claimed in claim 17, wherein the first storage unit and the second storage unit comprise at least one storage memory.

19. The data writing method for the storage device as claimed in claim 17, wherein the size of the spare capacity of the second storage unit is further determined according to a predetermined endurance of the first storage unit.

20. The data writing method for the storage device as claimed in claim 17, further comprising receiving an error message fed back from the storage device when there is no available spare block in the second storage device.

21. The data writing method for the storage device as claimed in claim 17, wherein the reliability is defined according to a usage attribute or a product segmentation of the storage device.

* * * * *